United States Patent [19]

Brune et al.

[11] Patent Number: 4,871,324
[45] Date of Patent: Oct. 3, 1989

[54] BACKPLANE FOR SUPPORTING REMOVABLE MODULAR

[75] Inventors: Johannes Brune, Erlangen; Hans-Peter Latussek, Feucht, both of Fed. Rep. of Germany

[73] Assignee: Siemens Aktiengesellschaft, Munich, Fed. Rep. of Germany

[21] Appl. No.: 170,145

[22] Filed: Mar. 18, 1988

[30] Foreign Application Priority Data

Mar. 20, 1987 [DE] Fed. Rep. of Germany ....... 3709119

[51] Int. Cl.$^4$ .................. H01R 9/22; H01R 13/70
[52] U.S. Cl. .................... 439/189; 361/407; 439/61; 200/61.19
[58] Field of Search ............. 439/55, 59–62, 439/92, 101, 108, 188, 189, 109; 361/407, 413, 415, 393, 392; 200/51.1, 61.19

[56] References Cited

U.S. PATENT DOCUMENTS

| 3,448,345 | 6/1969 | Koehler, Jr. | 361/407 |
| 3,778,754 | 12/1973 | Takahashi et al. | 439/109 |
| 4,070,557 | 1/1978 | Ostapovitch | 361/413 |

FOREIGN PATENT DOCUMENTS

| 0004899 | 4/1979 | European Pat. Off. |
| 0195955 | 3/1986 | European Pat. Off. |
| 2233578 | 1/1973 | Fed. Rep. of Germany |
| 8410261 | 7/1981 | Fed. Rep. of Germany |
| 2525065 | 10/1983 | France |
| 1523136 | 8/1978 | United Kingdom |

OTHER PUBLICATIONS

IEE, Journal of Electronic Engineering, Band 17, No. 157, Jan. 1980.

Primary Examiner—Neil Abrams
Attorney, Agent, or Firm—Kenyon & Kenyon

[57] ABSTRACT

A backplane has several socket connectors arranged in parallel, side by side, on a side facing the modules. The pins of the socket connectors form a pin field on a side of the backplane facing away from said modules. At least one bus consists of at least one bus line. Each bus contact pin of each socket connector of the bus is associated with a resilient contact pin. The resilient contact pins are each electrically connected by a spring force to the corresponding bus contact pin. The resilient contact pins are electrically connected by means of the bus line. The contact of each resilient contact pin can be separated with handling means formed from insulating material. Thus, modules can be separated from the bus without requiring that these modules be pulled out of their plug-in location on a module carrier.

12 Claims, 1 Drawing Sheet

BACKPLANE FOR SUPPORTING REMOVABLE MODULAR

RELATED APPLICATIONS

Of interest to the present application are copending applications titled "Backplane With Associated Handling Means" Ser. No. 170,146, filed on Mar. 18,1988, "Backplane Having A Jumper Plug to Connect Socket Connectors to a Bus Line" Ser. No. 170,766, having an assigned filing date of Mar. 21, 1988 and "Backplane Having A Movable Contact Means" Ser. No. 170,147, filed on Mar. 18, 1988, all of which have the same assignee and filing date as the present application.

BACKGROUND OF THE INVENTION

1. Field of the Invention.

The present invention relates to a backplane that has several socket connectors arranged in parallel, side by side on a side of the backplane that faces the module. The pins of these socket connectors form a pin field on a side that faces away from the module. At least one bus comprising at least one bus line interconnects the contact pins.

2. Description of Related Art.

Backplanes are commercially available and are known, for instance, as VME bus boards. The VME bus is a standardized bus which is responsible for fast data traffic between the most important components of a bus system. The bus structure forms the connecting bars between the building blocks and modules of a micro or minicomputer system. The bus structures also varies according to the system components used and the desired performance. The structure influences the performance of the overall system because the entire data exchange takes place via such bus systems. The data exchange takes place, for instance, in a 8-, 16- or 32-bit format. For example, 8, 16 or 32 bus line systems interconnect the individual modules of a bus system. A fault caused by a short circuit of an output driver with the supply voltage of a bus participant can block the entire bus system. A diagnostic routine can localize the defective bus participant for many types of faults. However, some types of faults can be determined only by sequentially separating all bus participants from the bus until the defective participant is found and the trouble corrected. The entire function of the participant concerned is put out of operation when the individual bus participants are pulled out of their plug-in locations in a module carrier. This fault isolation process leads to down time.

SUMMARY OF THE INVENTION

It is an object of the invention to develop an improved backplane that enables at least one module to be separated from a bus having several modules without having to pull out the module from its place in a module carrier.

According to the present invention, a resilient contact pin is allocated to a bus contact pin of each socket connector. The resilient contact pins are electrically interconnected with a spring force to the corresponding bus contact pin. The resilient contract pins of a bus are electrically interconnected with the bus line. The contact of each resilient contact pin with the corresponding bus contact pin can be separated using insulating material.

In contrast to known backplanes, the bus lines of the bus of the present invention do not connect the respective bus contact pins of the socket connectors to each other. Rather, the corresponding resilient contact pins are arranged parallel to the bus contact pins. These resilient contact pins make contact with the bus contact pins of the socket connectors with the spring force of the resilient contacts. The resilient contacts enable modules that are connected to parts of the bus that go beyond that module to be opened as desired using handling means that do not pull the module out of its plug-in location on a module carrier. Any desired module of the bus system which interferes with this bus due to a fault can be separated from the bus. Other functions of the module are not impaired. The down time of the system is thus reduced.

In one embodiment, the resilient contact pins allocated to a socket connector have a holding device made from insulating material. This design enables the additional spring contacts of each socket connector to be placed on the side facing away from the modules of the backplane. This structure substantially simplifies the manufacture of the backplane.

A further embodiment uses a holding device that is meander-shaped and has a step in the contact zone area of the o respective contact pins of the socket connectors and the resilient contact pins. This design of the holding device enables the resilient contact pins to function as a guide for the contact pins of the socket connectors.

In a further embodiment the holding means are provided with a U-shaped device that has shoulders formed in a flange region. The edges of the shoulders correspond to the resilient contact pins and are designed so that the separating motion at the handling means changes into a lifting motion of the respective resilient contact pins. The respective handling means can retain the separating function on the contact pins of each socket connector. These contact pins are not provided with bus contact pins because the handling means have a holding device.

A further embodiment of the backplane uses a housing to cover the contact pins of each socket connector and the corresponding resilient contact pins. The housing has an opening for the handling means. The voltage-carrying contact pins are thus covered to provide protection against unintentional contact with the voltage-carrying contact pins.

A further embodiment of the backplane also arranges the socket connectors in parallel, side by side on the side facing the modules and a bus comprising a bus line. The contact pins of each socket connector have spacers arranged between the respective socket connectors on the side of the backplane facing the modules. Each contact pin of each socket connector of a bus is assigned a corresponding contact pin with a resilient contact means. The corresponding contact pin is connected to the spacer and to the backplane. The resilient contact means are electrically connected to the bus contact pin. The corresponding contact pins are electrically connected to each other with a bus line. The electrically conducting connection between the bus contact pin and the resilient contact means can be severed with a handling means. The handling means and the separating part of the handling means are arranged on sides of the backplane and face away from each other.

This design locates only the handling means that are connected to the socket connectors on the side of the backplane that faces away from the module. It is not necessary to use the handling means to localize a fault in any module of a bus system that lies beyond the modules. Only the existing handling means need be actuated. In addition, the handling means can not be misplaced or removed by unauthorized persons. The handling means can be attached later on so that the assembly is substantially simplified since the backplane can be taken over a wave soldering bath.

DETAILED DESCRIPTION

Figure 1:
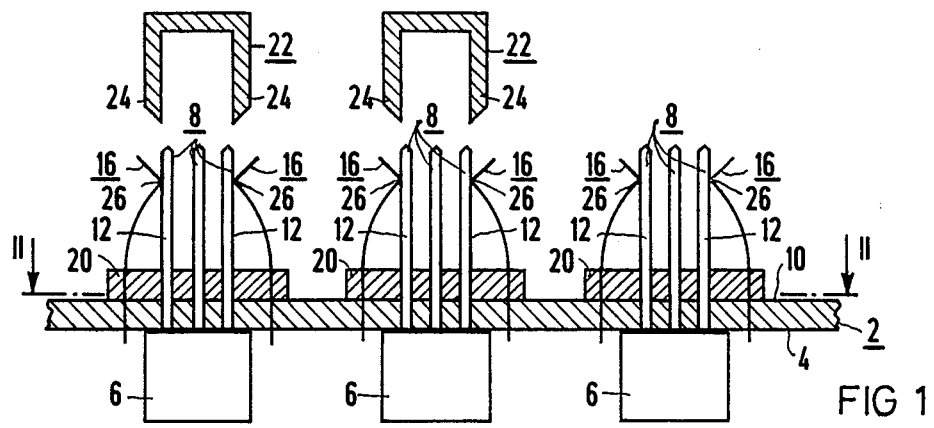
FIG. 1 shows a cross section through a backplane that uses two buses.
Figure 2:
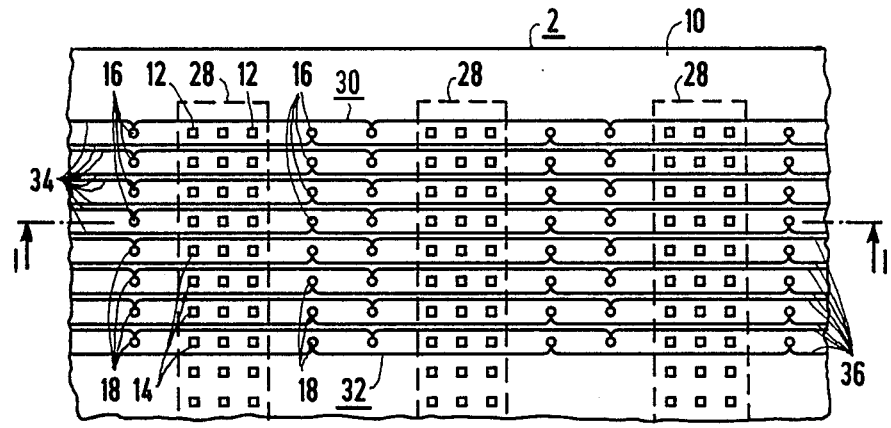
FIG. 2 shows a top view of the side of the backplane facing away from the modules along section II-II of FIG. 1.

FIG. 1 shows a backplane 2. Side 4 faces the modules and has several socket connectors 6 arranged parallel side by side. The pins 8 of these socket connectors 6 form a pin field on the side 10 and face away from the module. Each bus contact pins 12, 14 are assigned to resilient contact pins 16, 18, respectively. The bus contact pins 14 and the resilient contact pins 18 are not shown in FIG. 1 because the cross section through the backplane 2 is taken in accordance with FIG. 2. Further, only the bus contact pins 12 or 14 and the resilient contact pins 16 or 18 can be shown in FIG. 1 since these contacts are aligned in rows as shown in FIG. 2. The resilient contact pins 16 and 18 are arranged on the side 10 of the backplane 2 faces away from the modules. The resilient contact pins 16 and 18 of each socket connector 6 have a holding device 20 made form insulating material. Resilient contact pins 16 or 18 and holding device 20 thus form a structural unit. These structural units can be placed on side 10 of the backplane 2 faces away from the modules. The units are then taken over a wave soldering bath. The socket connectors 6 are then connected from the side 4 of the backplane 2 to the latter. The spring force of resilient contact pins 16 and 18 electrically connects them to the corresponding bus contact pins 12 and 14. Sufficiently high pressure can be provided to interrupt the generation of oxide layers at the bus contact pins 12 and 14. U-shaped handling means 22 control the contact between the resilient contact pin 16 or 18 and the corresponding bus contact pins 12 or 14. The corresponding bus contact pins 12 and 14 can be controlled so that the handling means separates the electrically conducting o connection of two corresponding contact pins 12, 16 or 14, 18, respectively. The free ends of legs 24 of the U-shaped handling means 22 are beveled to better engage behind the resilient contacts 16 or 18. When the handling means 22 are slipped on, the resilient contact pins 16 or 18 are lifted while the contact projections 26 are moved with a scratching motion along the corresponding bus contact pins 12 or 14. This motion of the contact projections 26 removes an oxide layer formed at the bus contact pins 12 or 14.

FIG. 2 shows a top view on the side 10 of the backplane 2 that faces away from the module along cross section II-II of FIG. 1. The socket connectors 6 are arranged on the side 4 of the backplane 2 and face the modules as shown by dashed line 28. The socket connectors 6 are 96-pole socket connectors, the contact pins 8 can be arranged in three rows. In addition, buses 30 and 32 have eight bus lines 34 and 36, respectively. Bus 32 is redundant with the bus 30. A bus system 30 having eight bus lines 34 that go beyond the bus groups has eight bus contact pins 12 on each socket connector 6. The outer contact rows of each socket connector have four bus contact pins 12. Each socket connector 6 also has eight bus contacts pins 14 because the bus system 30 is redundant. The contact pins of each socket connector 6 have outer rows of contacts that follow bus contact pins 12 and 14. Bus contact pins 12 and 14 are associated with a resilient contact pin 16 and 18, respectively. The contact pins 16 are electrically connected to each other with bus line 34 of the bus 30. In contrast, contact pins 18 are electrically connected to each s other with bus line 36 of the bus 32. The depth of the handling means 22 must correspond to the width of the bus 30 o and 32, respectively, because the two buses 30 and 32 have a format of eight bus lines.

All bus participating modules are connected to the two buses 30 and 32 when backplane 2 is operating. The data transfer between the individual bus modules occurs on the bus 30. If a fault occurs on bus 30, one can switch to bus 32 since buses 30 and 32 are redundant. The system thus remains in operation despite a fault. The fault is localized on bus 30 by sequentially separating the modules from the bus 30 with handling means 22. A suitable test routine determines at which module the blocking of the bus 30 is terminated. The defective bus participant module can thus be localized and replaced. Indirectly coupling the bus participant module to the buses 30 and 32 that go beyond the modules enables individual modules to be separated at any time from the buses 30 and 32 without having to switch off the system. The additional functions of the modules that are separated from the bus remain in operation. The operating time of the system is thus increased.

Figures 3, 4, 5:
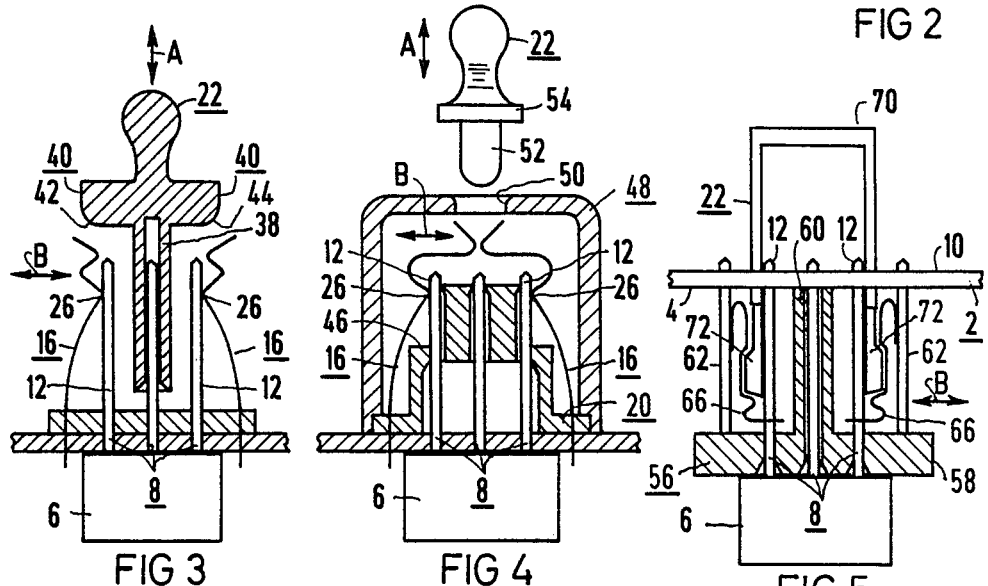
FIG. 3 shows an embodiment of the handling means.
FIG. 4 shows an encapsulated embodiment of the present invention.
FIG. 5 illustrates a further embodiment of the present invention.

FIG. 3 shows an advantageous handling means 22 comprising a U-shaped holding device 38 having lateral lo shoulders 40. The edges 42 and 44 of the shoulder 40 correspond to the resilient contact pins 16 or 18 and are designed so that the separating motion of the handling means 22, shown by a double arrow A, changes into a lifting motion of the resilient contact pins 1 and 18, shown by double arrow B. In this course of motion the contact projection 26 of the resilient contact pins 16 or 18 also moves along the corresponding contact pins 12 or 14 and thus scrapes off the oxide layer. Holding device 38 enables handling means 22 to better stay in the separating position.

FIG. 4 shows an encapsulated embodiment the present invention where the holding device 20 is meander-shaped. In addition, the holding device 20 has a contact zone area with a step 46. This design of the holding device 20 enables the respective contact pins 8 of the socket connector 6 to be guided and adjusted. This embodiment also connects the resilient contact pins 16 or 18 to holding device 20. Contact between the resilient contact pins 16 or 18 and the corresponding bus contact pins 12 or 14 is made by using the spring force of the contact pins 16 or 18. Contact pins 16 and 18 further comprise contact projections 26 to remove an oxide layer in the corresponding bus contact pins 12 and 14 through pressure or by a scraping motion when the contact pins 12, 16, and 14, 18, are separated by handling means 22. The voltage-carrying contact pins 12, 14, 16 and 18 are covered by a housing 48. The housing has an opening 50 for the handling means 22. Separator 52 of the handling means 22 of this embodiment changes the separating motion, shown by double arrow A, into a lifting motion of the resilient contact pins 16 and 18, shown by double arrow B. In addition, the handling means 22 has laterally attached support means 54 to support handling means 22 on housing 48.

FIG. 5 shows a further embodiment of the present invention. The socket connectors 6, of which only one is shown, have spacers 56. Each spacer is arranged between the socket connector 6 and the side 4 of the backplane 2 that faces the modules. The spacer 56 comprises a base plate 58 and a U-shaped guide 60. The base place 58 has holes arranged in rows. At least one row is arranged in line with the U-shaped guide 60. Base plate 56- has corresponding contact pins 62 and 64, each of which have resilient contact means 66 and 68, respectively. The corresponding contact pins 64 and the resilient contact means 68 are not shown in this figure since they are covered by the corresponding contact pins 62 and by the resilient contact pins 66. The contact pins 62 and 64 and the contact pins 66 and 68 are arranged in rows as in the embodiment of the present invention shown in FIG. 2. The corresponding contact pins 62 and 64 are connected to the base plate 58 and to the backplane 2. Resilient contact means 66 or 68 are pushed against corresponding bus contact pins 12 or 14 so as to remove the oxide layers generated at the bus contact pins 12 or 14. The contact pins 8 of the socket connectors 6 are shaped as posts. It is therefore particularly advantageous that the resilient contact means 66 and 68 have the shape of wedges so as to partially surround the corresponding bus contact pins. The embodiment of the handling means 22 attaches the handling means 70 and the separator 72 to mutually opposite sides 4 and 10 of the backplane 2. The part of the separator 72 of the handling means 22 against which the resilient contact means 66 and 68 are braced are designed so that a separating motion, shown by double arrow A, changes into a lifting motion of the resilient contact means 66 and 68, shown by double arrow B. This motion guides the resilient contact means 66 and 68 along corresponding bus contact pins 12 and 13 with a scraping motion to remove any oxide layers. This embodiment of the present invention needs no handling means 22. Hence, there are no handling means to lose. A person repairing the backplane need not bring along a handling means 22. The handles 70 of the handling means 22 are arranged on the side 10 of the backplane 2 that faces away from the modules. The fault localization of a fault occurring in a module of the bus system that extends beyond the modules is thus simplified.

What is claimed is:

1. A backplane for a subrack having modules, comprising:
    a plurality of socket connectors arranged in parallel next to each other on a side of the backplane facing the modules;
    each of said socket connectors comprising a plurality of pins and bus contact pins on the side of the backplane facing away from said modules;
    said pins and said bus contact pins of said socket connectors together forming a pin field on the side of the backplane facing away from said modules;
    at least one bus having at least one bus line;
    a plurality of resilient contact pins corresponding to a bus contact pin of each socket connector, said resilient contact pins being electrically connected with spring force to said associated bus contact pin;
    said resilient contact pins of a bus being electrically interconnected with the bus line; and
    means for separating each of said resilient contact pins from its associated bus contact with a handling means made of insulating material.

2. A backplane as claimed in claim 1, wherein said resilient contact pins of at least one socket connector further comprises a holding device made of insulating material.

3. A backplane as claimed in claim 2, wherein said holding device comprises a board.

4. A backplane as claimed in claim 2, wherein:
    said holding device has a meander-shape and comprises a contact zone area of said contact pins of said socket connector
    with a step.

5. A backplane as claimed in claim 1, wherein said handling means is U-shaped and has legs with beveled ends.

6. A backplane as claimed in claim 1, wherein said handling means comprises means for changing a separating motion into a lifting motion of said resilient contact pins with a U-shaped holding device having shoulders formed in a flange area, said shoulders having edges corresponding to said resilient contact pins.

7. A backplane as claimed in claim 1, wherein said handling means comprises a flange-like separating part having a rounded free end and laterally attached bracing means.

8. A backplane as claimed in claim 1, further comprising a housing to cover said contact pins of each socket connector and said corresponding resilient contact pins, said housing comprising an opening for said handling means.

9. A backplane for a subrack having modules, comprising:
    a plurality of socket connectors arranged in parallel on a side facing the modules;
    a spacer positioned between said socket connectors and a back wall of the backplane on a side facing the modules;
    a bus contact pin associated with each of said socket connectors connected between said spaces and said back wall;
    resilient contact pins electrically connected to each of said bus contact pins;
    at least one bus comprising at least one bus line, said associated contact pins being electrically interconnected by means of the bus line; and
    means for separating each resilient contact pin from its respective bus contact pin of each socket connector, comprising two handling means having a handle and separator positioned to face away from each other on the back wall of the backplane.

10. A backplane as claimed in claim 9, comprising a wedge contact region for said resilient contact means.

11. A backplane as claimed in claim 9, further comprising means for changing a separating motion of said separating means into a lifting motion of said resilient contact means by pressing said handle against said resilient contact means.

12. A backplane as claimed in claim 9, wherein said separating means comprises insulating material.

* * * * *